(12) United States Patent
Hsia et al.

(10) Patent No.: US 9,929,741 B1
(45) Date of Patent: Mar. 27, 2018

(54) CONTROL CIRCUIT FOR CURRENT SWITCH OF CURRENT DAC

(71) Applicant: NOVATEK Microelectronics Corp., Hsin-Chu (TW)

(72) Inventors: Chu-Wei Hsia, Kaohsiung (TW); Mu-Jung Chen, Tainan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/354,989

(22) Filed: Nov. 17, 2016

(51) Int. Cl.
   *H03M 1/66* (2006.01)
(52) U.S. Cl.
   CPC .................................. *H03M 1/66* (2013.01)
(58) Field of Classification Search
   CPC ........ H03M 1/765; H03M 1/66; H03M 1/742; H03M 1/0624; H03M 1/747; H03M 1/0863; H03M 1/745; H03M 1/687
   USPC ................. 341/118, 120, 144, 153
   See application file for complete search history.

(56) References Cited

U.S. PATENT DOCUMENTS

| | | | | |
|---|---|---|---|---|
| 6,100,830 A * | 8/2000 | Dedic | ............. | H03K 17/04106 341/118 |
| 6,184,813 B1 * | 2/2001 | Abughazaleh | ......... | H03M 1/74 341/144 |
| 6,392,573 B1 * | 5/2002 | Volk | ................. | H03K 17/04106 341/118 |
| 6,992,608 B2 * | 1/2006 | Zhang | ................. | H03M 1/0624 341/136 |
| 2005/0225465 A1 * | 10/2005 | Zhang | ................. | H03M 1/0624 341/144 |
| 2007/0024479 A1 * | 2/2007 | Lin | ..................... | H03K 3/35613 341/144 |
| 2009/0045995 A1 * | 2/2009 | Nozawa | ............... | H03K 5/2481 341/158 |
| 2013/0252559 A1 * | 9/2013 | Deguchi | ............. | H03M 1/1061 455/73 |
| 2015/0295585 A1 * | 10/2015 | Cheng | ................... | H03M 1/002 341/144 |

* cited by examiner

*Primary Examiner* — Linh Nguyen
(74) *Attorney, Agent, or Firm* — Winston Hsu

(57) ABSTRACT

A control circuit for a current switch of a current digital to analog converter (DAC) includes a first inverter, a second inverter, a first pull-low switch, a second pull-low switch and a timing synchronization circuit. The first inverter includes an input terminal and an output terminal. The second inverter includes an input terminal and an output terminal, wherein the input terminal of the second inverter is coupled to the output terminal of the first inverter, and the output terminal of the second inverter is coupled to the input terminal of the first inverter. The first pull-low switch is coupled to the input terminal of the first inverter. The second pull-low switch is coupled to the input terminal of the second inverter. The timing synchronization circuit is coupled to the first pull-low switch and the second pull-low switch.

9 Claims, 4 Drawing Sheets

CONTROL CIRCUIT FOR CURRENT SWITCH OF CURRENT DAC

BACKGROUND OF THE INVENTION

1. Field of the Invention

The present invention relates to a control circuit for a current switch of a current digital to analog converter (DAC), and more particularly, to a control circuit capable of controlling operations of the current switch of the current DAC.

2. Description of the Prior Art

A current digital to analog converter (DAC) is a DAC which outputs currents based on received digital data. A current DAC includes a plurality of current cells, each of which includes a current switch. The currents are switched in every current switch based on the received digital data, in order to determine the output current of the current DAC.

With advancements of the process, the digital logic circuit such as a data decoder may be implemented in a low voltage domain to reduce power consumption and chip area. However, the current DACs are usually operated in a higher voltage domain due to requirements of system specification and/or back-end circuits. In such a situation, the current switch should be implemented in the higher voltage domain, and thus a level shifter, which consumes a lot of power and circuit areas, is required to be included in each current cell. A switch driver is coupled to the current switch, for driving the current switch and adjusting the cross point of the current switch, in order to enhance the linearity of the current DAC. A latch or D flip-flop is usually implemented in the current cell for timing synchronization of the current DAC. These modules are necessary and consume a lot of power and circuit areas. Thus, there is a need to provide a simplified structure for the current cell of the current DAC, in order to reduce power consumption and circuit areas without affecting the performance of the current DAC.

SUMMARY OF THE INVENTION

It is therefore an objective of the present invention to provide a control circuit for a current switch of a current digital to analog converter (DAC), where the control circuit has a simplified circuit structure and consumes less power and circuit areas.

An embodiment of the present invention discloses a control circuit for a current switch of a current DAC. The control circuit includes a first inverter, a second inverter, a first pull-low switch, a second pull-low switch and a timing synchronization circuit. The first inverter includes an input terminal and an output terminal. The second inverter includes an input terminal and an output terminal, wherein the input terminal of the second inverter is coupled to the output terminal of the first inverter, and the output terminal of the second inverter is coupled to the input terminal of the first inverter. The first pull-low switch is coupled to the input terminal of the first inverter. The second pull-low switch is coupled to the input terminal of the second inverter. The timing synchronization circuit is coupled to the first pull-low switch and the second pull-low switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
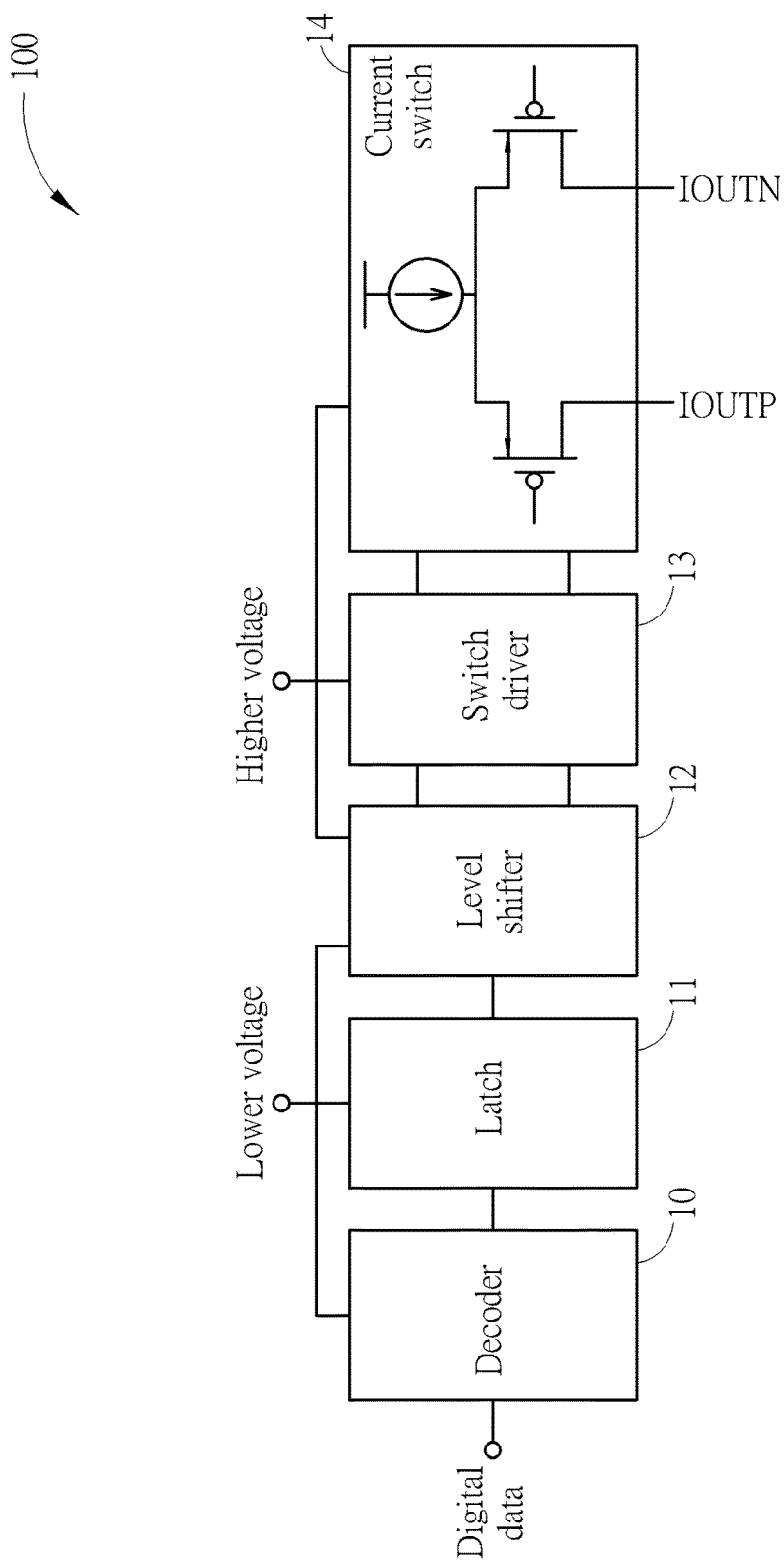
FIG. 1 is a schematic diagram of a current cell of a current DAC.

Please refer to FIG. 1, which is a schematic diagram of a current cell 100 of a current digital to analog converter (DAC). The current cell 100 includes a decoder 10, a latch 11, a level shifter 12, a switch driver 13 and a current switch 14. These elements or modules are necessary in a general current cell of the current DAC. The decoder 10 and the latch 11 are usually implemented in a lower voltage domain, e.g., 1.0 V, in order to reduce power consumption and circuit areas. The switch driver 13 and the current switch 14 are usually implemented in a higher voltage domain, e.g., 3.3 V, due to system requirements. Therefore, the level shifter 12 is included to convert the operating voltage and connect different voltage domains. With the operations of the current cell 100, digital data may be converted to the output current, which may be switched between the current paths of the current switch 14, i.e., IOUTP and IOUTN. In general, a current DAC may include a plurality of current cells, and the currents outputted from the current switches in the current cells are combined to generate the output current of the current DAC.

Figure 2:
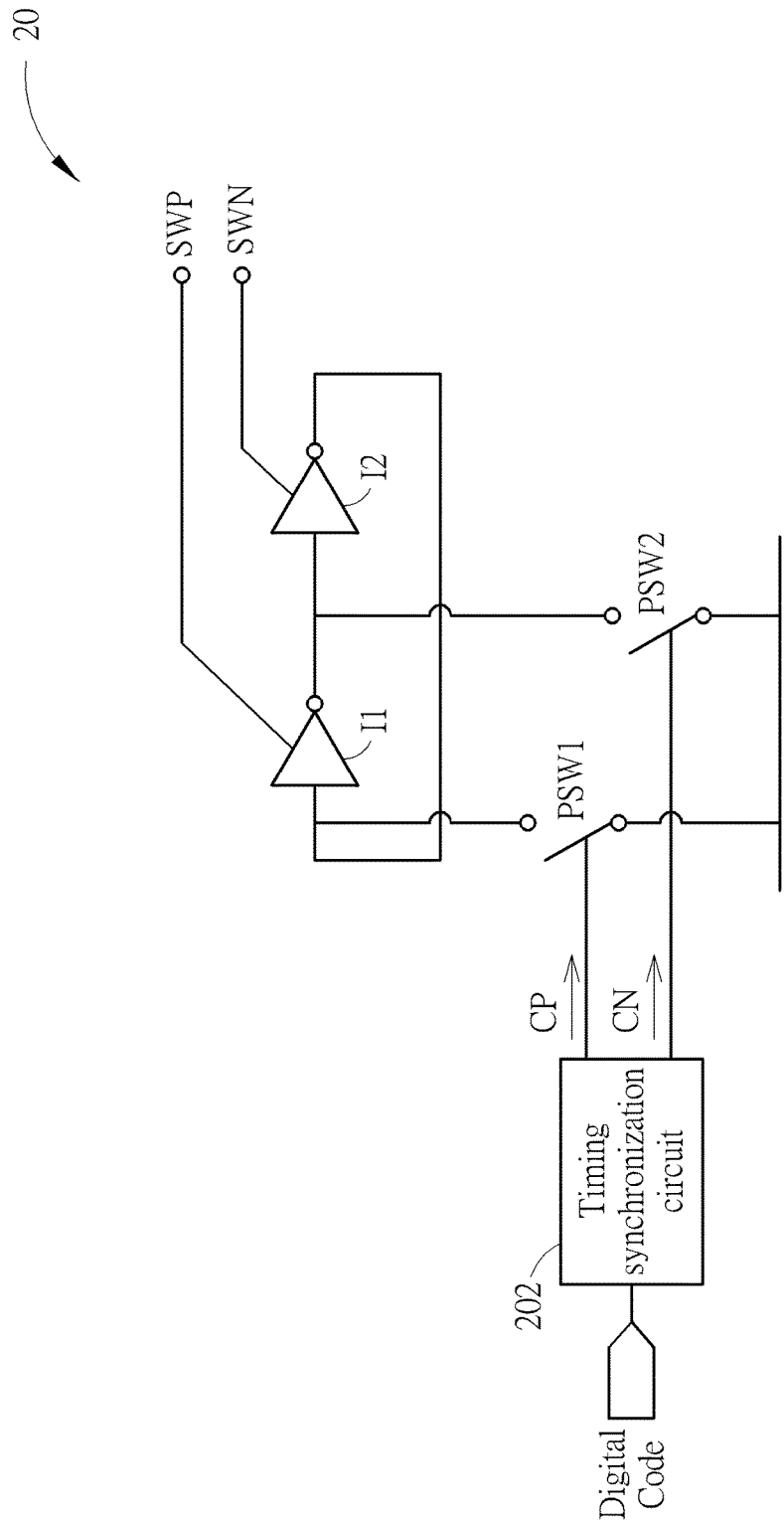
FIG. 2 is a schematic diagram of a control circuit according to an embodiment of the present invention.

In an embodiment of the present invention, the level shifter and the switch driver are combined to generate a simplified control circuit for the current switch. Please refer to FIG. 2, which is a schematic diagram of a control circuit 20 according to an embodiment of the present invention. As shown in FIG. 2, the control circuit 20 includes inverters I1 and I2, pull-low switches PSW1 and PSW2 and a timing synchronization circuit 202. The inverters I1 and I2 are connected to each other. In detail, the input terminal of the inverter I2 is coupled to the output terminal of the inverter I1, and the output terminal of the inverter I2 is coupled to the input terminal of the inverter I1. The inverters I1 and I2 output switch signals SWP and SWN, respectively, to a current switch of a current cell, such as the current switch 14 shown in FIG. 1, in order to control the current path of the current switch. The pull-low switches PSW1 and PSW2 drive the inverters I1 and I2 to output the switch signals SWP and SWN. In detail, the pull-low switch PSW1 is coupled to the input terminal of the inverter I1, and the pull-low switch PSW2 is coupled to the input terminal of the inverter I2. The timing synchronization circuit 202, which is coupled to the pull-low switches PSW1 and PSW2, receives a digital code from a digital data decoder, e.g., the decoder 10 shown in FIG. 1, and outputs control signals CP and CN to the pull-low switches PSW1 and PSW2 accordingly. As mentioned above, a current DAC may include a plurality of current cells, and the currents outputted from the current switches in the current cells should be synchronized. Therefore, the timing synchronization circuit 202 performs the synchronization of every current cell.

Please note that the implementations of the control circuit 20 allow the latch, level shifter and switch driver in a conventional current cell to be replaced with a simplified circuit structure. In order to achieve a higher speed and smaller circuit area, the timing synchronization circuit 202 is implemented in a lower voltage domain, e.g., 1.0V. The inverters I1 and I2 are implemented in a higher voltage domain, e.g., 3.3 V, due to system requirements. The pull-low switches PSW1 and PSW2 may act as level shifters which convert signals from the lower voltage domain to the higher voltage domain.

As shown in FIG. 2, when the timing synchronization circuit 202 receives a digital code from a data decoder, the timing synchronization circuit 202 may convert the digital code to the control signals CP and CN, and output the control signals CP and CN at a configured time point. The time point is configured to be synchronous with other timing synchronization circuits in other current cells of the current DAC. More specifically, the timing synchronization circuit 202 may output the control signal CP to the pull-low switch PSW1 and output the control signal CN to the pull-low switch PSW2. Subsequently, the pull-low switch PSW1 performs pull-low operations in response to reception of the control signal CP, and the pull-low switch PSW2 performs pull-low operations in response to reception of the control signal CN. The inverters I1 and I2 then output the switch signals SWP and SWN in response to the pull-low operations of the pull-low switches PSW1 and PSW2, and thereby drive the current switch to switch current paths.

Figure 3:
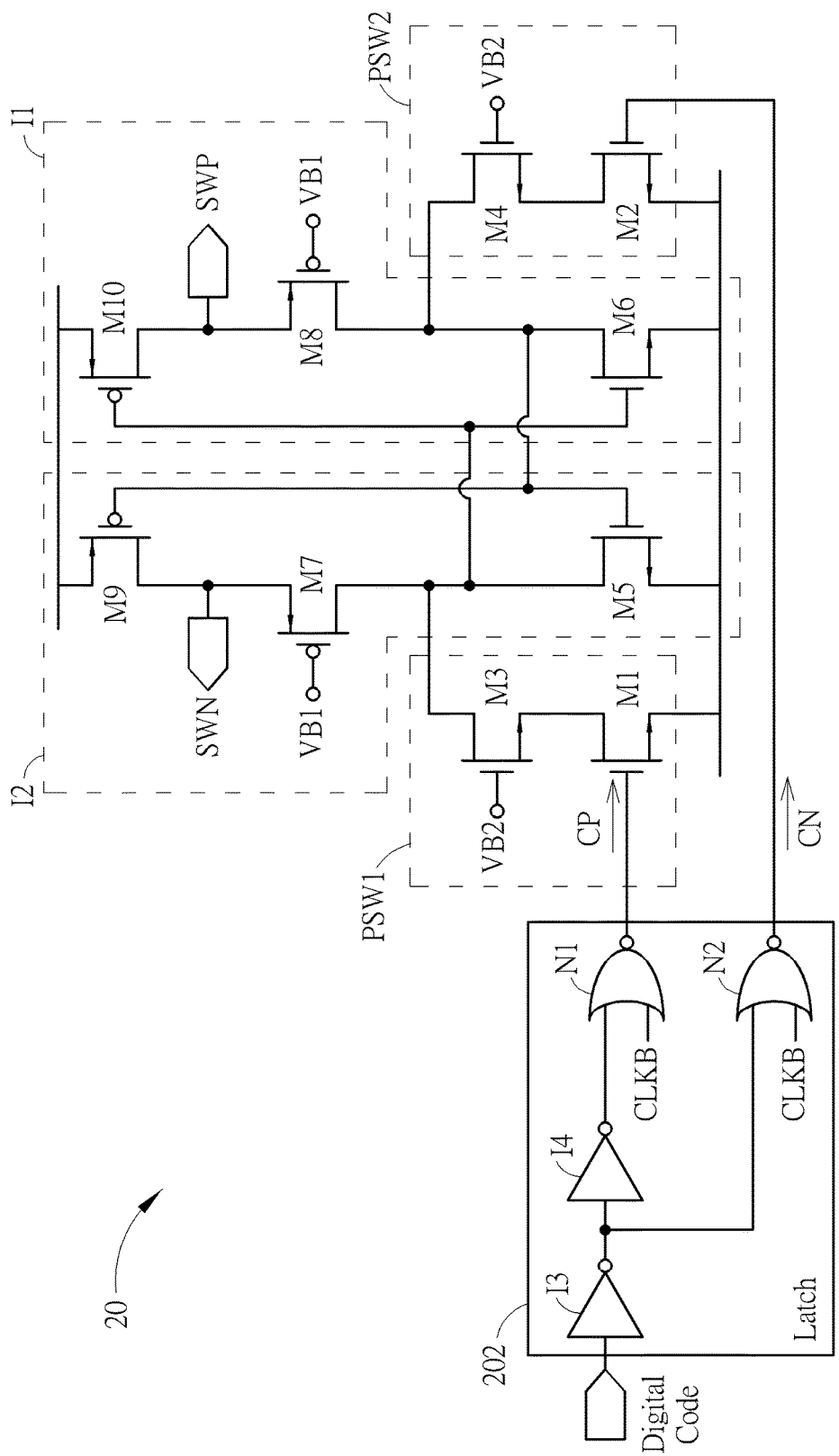
FIG. 3 is a schematic diagram of an implementation of the control circuit.

Please refer to FIG. 3, which is a schematic diagram of an implementation of the control circuit 20. As shown in FIG. 3, the inverter I1 includes transistors M6, M8 and M10. The transistors M6 and M10 act as a general inverter, where the gate terminal of the transistor M6 is coupled to the gate terminal of the transistor M10. The transistor M8 is coupled between the drain terminal of the transistor M6 and the drain terminal of the transistor M10, and receives a bias voltage VB1 in its gate terminal. Similarly, the inverter I2 includes transistors M5, M7 and M9. The transistors M5 and M9 act as a general inverter, where the gate terminal of the transistor M5 is coupled to the gate terminal of the transistor M9. The transistor M7 is coupled between the drain terminal of the transistor M5 and the drain terminal of the transistor M9, and receives the bias voltage VB1 in its gate terminal. The bias voltage VB1 and the size of the transistors M7 and M8 may be configured or adjusted, to adjust the cross point of current switching in the current switch. The adjustment of the cross point may lead to preferable linearity of the current DAC.

In addition, the pull-low switch PSW1 includes two NMOS transistors M1 and M3 connected in cascode configuration, and the pull-low switch PSW2 includes two NMOS transistors M2 and M4 connected in cascode configuration. As mentioned above, the pull-low switches PSW1 and PSW2 act as level shifters which convert signals from the lower voltage domain to the higher voltage domain. Therefore, the transistors M1 and M2, which receive the control signals CP and CN from the timing synchronization circuit 202 to drive the inverters I1 and I2, may be low-voltage devices, which provide a higher driving speed and occupy a smaller circuit area. The transistors M3 and M4, which receive a bias voltage VB2, are stacked on the transistors M1 and M2, in order to prevent overstress issues and reliability problems on the low-voltage devices, i.e., the transistors M1 and M2. As can be seen, the inverters I1 and I2 and the pull-low switches PSW1 and PSW2 are combined and integrated in the output stage of the control circuit 20. This output stage receives the control signals CP and CN having a lower voltage level, and outputs the switch signals SWP and SWN having a higher voltage level to drive the current switch; hence, the functions of the level shifter and the switch driver in the conventional current cell are integrated in the output stage, so as to simplify the circuit structure of the current cell. Please note that the level shifter and switch driver in the convention current cell both include high-voltage devices, which require high power and large circuit areas. Therefore, the combination and simplification of the level shifter and switch driver save a great amount of power consumption and circuit area. Further, since a current DAC may include a lot of such current cells, the simplification provided in the present invention leads to a significant reduction in the circuit areas of the current DAC.

Please keep referring to FIG. 3. The timing synchronization circuit 202 may be implemented with a latch. The latch includes two inverters I3 and I4 and two NOR gates N1 and N2. The NOR gates N1 and N2 are located at the output stage of the latch, where the NOR gate N1 outputs the control signal CP to the pull-low switch PSW1 and the NOR gate N2 outputs the control signal CN to the pull-low switch PSW2. An input terminal of the NOR gates N1 and N2 receives a clock signal CLKB, which configures the time point for outputting the control signals CP and CN, in order to be synchronous with other current cells in the current DAC. With the simplified circuit structure of the present invention, there are only two circuit stages between the clock signal CLKB and the switch signals SWP and SWN, i.e., the NOR gate N1/N2 and the pull-low switch PSW1/PSW2. Thus, there is less timing delay between the clock signal CLKB and the switch signals SWP and SWN in contrast to the conventional circuit structure. The reduction of timing delay allows the current DAC to operate in a higher speed. In addition, the mismatch between different current cells may also be reduced due to less timing delay; this further enhances the linearity of the current DAC.

Please note that the present invention provides a control circuit having a simplified circuit structure for a current switch of a current DAC. Those skilled in the art should be able to make modifications and alternations accordingly. For example, the implementation shown in FIG. 3 is only one of various embodiments of the present invention. In another embodiment, the timing synchronization circuit 202 may be implemented with a D flip-flop instead.

Figure 4:
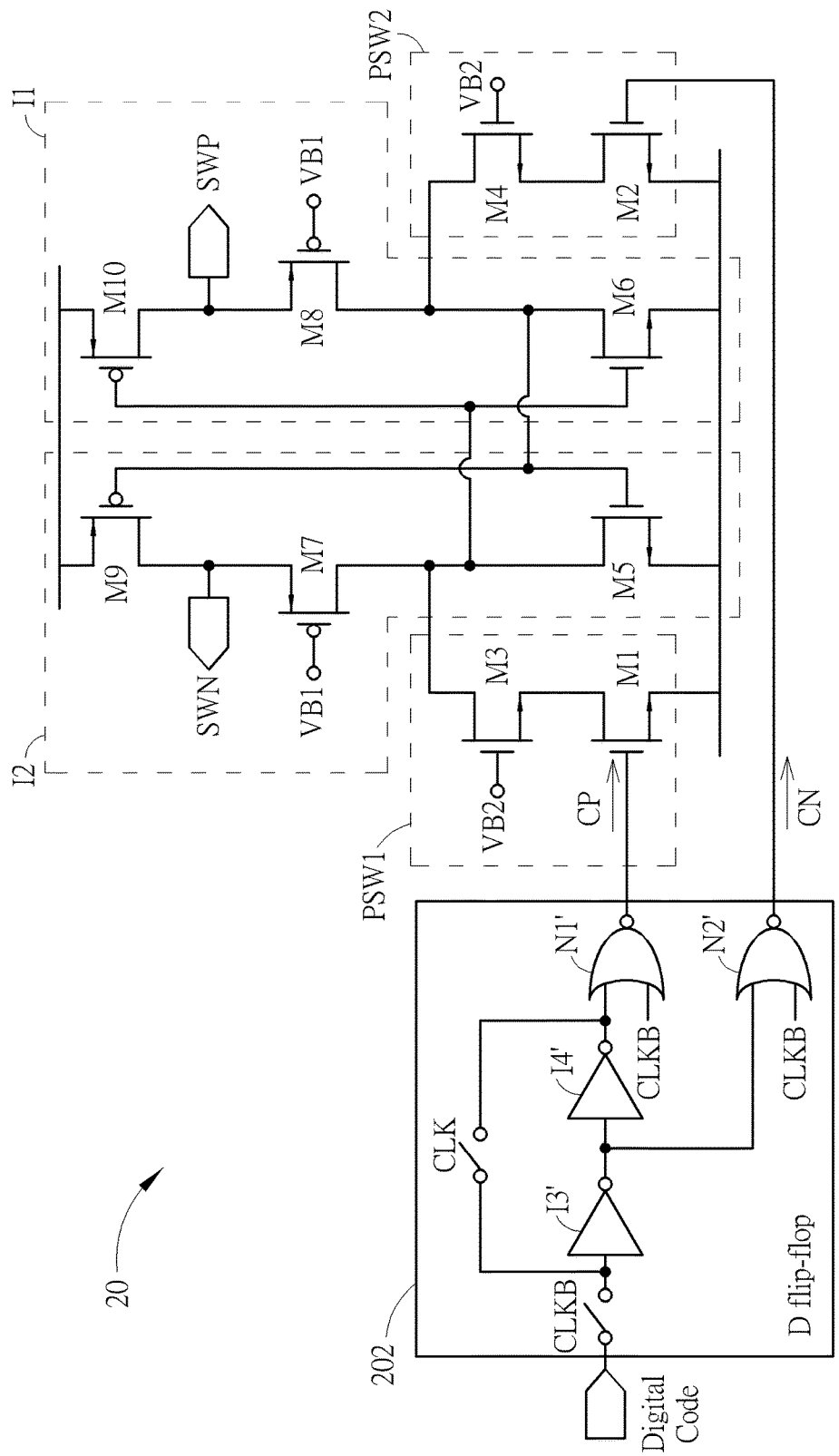
FIG. 4 is a schematic diagram of another implementation of the control circuit.

Please refer to FIG. 4, which is a schematic diagram of another implementation of the control circuit 20. The difference between the control circuit 20 shown in FIG. 4 and that shown in FIG. 3 is that the timing synchronization circuit 202 in FIG. 4 is implemented with a D flip-flop. Similarly, in the D flip-flop shown in FIG. 4, the NOR gates N1' and N2' are located at the output stage of the D flip-flop. An input terminal of the NOR gates N1' and N2' receives a clock signal CLKB, which configures the time point for outputting the control signals CP and CN, in order to be synchronous with other current cells in the current DAC. The D flip-flop is capable of dealing with more critical timing, and thereby may be applied in a current DAC having a higher operating speed. The detailed operations of the control circuit 20 shown in FIG. 4 are similar to the operations of the control circuit 20 shown in FIG. 3, and will not be narrated herein.

To sum up, the present invention provides a control circuit for a current switch of a current DAC. The control circuit has a simplified circuit structure and consumes less power and circuit areas. The output stage of the control circuit is composed of inverters and pull-low switches, and thus the functions of the level shifter and switch driver are integrated in the output stage, so as to simplify the circuit structure. The timing synchronization circuit of the control circuit may be implemented with a latch or a D flip-flop. The structure of the timing synchronization circuit reduces the timing delay between the input clock signal and the switch signal for the current switch. This allows the current DAC to operate in a higher speed. In addition, the mismatch between different current cells may also be reduced due to less timing delay; this enhances the linearity of the current DAC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit for a current switch of a current digital to analog converter (DAC), comprising:
    a first inverter, comprising an input terminal and an output terminal;
    a second inverter, comprising an input terminal and an output terminal, wherein the input terminal of the second inverter is coupled to the output terminal of the first inverter, and the output terminal of the second inverter is coupled to the input terminal of the first inverter;
    a first pull-low switch, coupled to the input terminal of the first inverter;
    a second pull-low switch, coupled to the input terminal of the second inverter; and
    a timing synchronization circuit, coupled to the first pull-low switch and the second pull-low switch;
    wherein the timing synchronization circuit is implemented in a first voltage domain, and the first inverter and the second inverter are implemented in a second voltage domain, wherein the second voltage domain is higher than the first voltage domain;
    wherein the timing synchronization circuit comprises a latch, and the latch comprises:
        a first logic gate, located at an output stage of the latch; and
        a second logic gate, located at the output stage of the latch;
    wherein each of the first inverter and the second inverter comprises:
        a first transistor, comprising a gate terminal and a drain terminal;
        a second transistor, comprising a gate terminal coupled to the gate terminal of the first transistor, and a drain terminal; and
        a third transistor, coupled between the drain terminal of the first transistor and the drain terminal of the second transistor, for generating a switch signal for the current switch and adjusting a cross point of current switching in the current switch.

2. The control circuit of claim 1, wherein the first pull-low switch and the second pull-low switch convert signals from the first voltage domain to the second voltage domain.

3. The control circuit of claim 1, wherein the first inverter and the second inverter output a first switch signal and a second switch signal to the current switch in response to pull-low operations of the first pull-low switch and the second pull-low switch.

4. The control circuit of claim 3, wherein the first pull-low switch and the second pull-low switch perform the pull-low operations in response to reception of a first control signal and a second control signal from the timing synchronization circuit.

5. The control circuit of claim 4, wherein the timing synchronization circuit converts a digital code to the first control signal and the second control signal, and outputs the first control signal and the second control signal at a configured time point.

6. The control circuit of claim 1, wherein each of the first pull-low switch and the second pull-low switch comprises two NMOS transistors connected in cascode configuration.

7. The control circuit of claim 1, wherein the first logic gate is configured for outputting a first control signal to the first pull-low switch; and
    the second logic gate is configured for outputting a second control signal to the second pull-low switch;
    wherein an input terminal of the first logic gate and an input terminal of the second logic gate receive a clock signal, and the clock signal configures a time point for outputting the first control signal and the second control signal.

8. The control circuit of claim 1, wherein the timing synchronization circuit comprises a D flip-flop.

9. The control circuit of claim 8, wherein the D flip-flop comprises:
    a first logic gate, located at an output stage of the D flip-flop, for outputting a first control signal to the first pull-low switch; and
    a second logic gate, located at the output stage of the D flip-flop, for outputting a second control signal to the second pull-low switch;
    wherein an input terminal of the first logic gate and an input terminal of the second logic gate receive a clock signal, and the clock signal configures a time point for outputting the first control signal and the second control signal.

* * * * *